(12) United States Patent
Chen et al.

(10) Patent No.: US 10,235,634 B1
(45) Date of Patent: Mar. 19, 2019

(54) MAGNETIC FLUX CONTROL IN SUPERCONDUCTING DEVICE

(71) Applicant: Google LLC, Mountain View, CA (US)

(72) Inventors: Yu Chen, Goleta, CA (US); Dvir Kafri, Los Angeles, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/686,902

(22) Filed: Aug. 25, 2017

(51) Int. Cl.
*G06N 99/00* (2010.01)
*H01P 3/00* (2006.01)
*H01L 39/22* (2006.01)
*H05K 1/11* (2006.01)
*H05K 1/18* (2006.01)
*H01P 5/02* (2006.01)

(52) U.S. Cl.
CPC ......... *G06N 99/002* (2013.01); *H01L 39/223* (2013.01); *H01P 3/003* (2013.01); *H01P 5/02* (2013.01); *H05K 1/111* (2013.01); *H05K 1/181* (2013.01)

(58) Field of Classification Search
CPC ............................ G06N 99/002; H01L 39/223
USPC .......................................................... 257/31
See application file for complete search history.

(56) References Cited

U.S. PATENT DOCUMENTS

| 2005/0248421 | A1 | 11/2005 | Joodaki |
| 2012/0212375 | A1* | 8/2012 | Depree, IV ............ B82Y 10/00 343/700 MS |
| 2016/0267032 | A1 | 9/2016 | Rigetti et al. |

FOREIGN PATENT DOCUMENTS

| JP | 2005-223468 | 8/2005 |
| JP | 2008-527684 | 7/2008 |
| JP | 2010-511293 | 4/2010 |
| JP | 2011-226819 | 11/2011 |
| JP | 2018-514094 | 5/2018 |
| WO | WO 2006069450 | 7/2006 |
| WO | WO 2008064491 | 6/2008 |
| WO | WO 216126981 | 8/2016 |
| WO | 2017/058194 | 4/2017 |
| WO | WO 2017/105429 | 6/2017 |

OTHER PUBLICATIONS

Harris et al. "Compound Josephson-junction coupler for flux qubits with minimal crosstalk," Physical Review B vol. 80, 052506, Aug. 2009, 4 pages.

Quintana et al. "Observation of classical-quantum crossover of 1/f flux noise and its paramagnetic dependence," Physical Review Letters 118.5, 057702, Jan. 2017, 6 pages.

(Continued)

*Primary Examiner* — Jami Valentine Miller
(74) *Attorney, Agent, or Firm* — Fish & Richardson P.C.

(57) ABSTRACT

A device includes: a first qubit including a first co-planar waveguide; a second qubit including a second co-planar waveguide, in which the second co-planar waveguide crosses the first co-planar waveguide; and a qubit coupler including a loop having a first lobe and a second lobe, in which a first portion of the first lobe extends parallel to the first co-planar waveguide, a second portion of the first lobe extends parallel to the second co-planar waveguide, a first portion of the second lobe extends parallel to the first co-planar waveguide, and a second portion of the second lobe extends parallel to the second co-planar waveguide.

26 Claims, 11 Drawing Sheets

(56) References Cited

OTHER PUBLICATIONS

Kafri et al. "Tunable inductive coupling of superconducting qubits in the strongly nonlinear regime," Physical Review A, 95, 052333, May 17, 2017, 26 pages.
Satoh. "Fabrication of Superconducting Quibits with AL Trilayer Joseph Son Junctions," IEEE Translations on Applied Superconductivity, vol. 25(3), Jun. 2015, 5 pages.
'www.rfwireless-world.com' [online] "CPW (Coplanar Waveguide) Basics," Available on or before Dec. 22, 2014 via the wayback internet archive, [retrieved on Oct. 16, 2018] Retrieved from Internet: URL<www.rfwireless-world.com/Terminology/CPW-Coplanar-Waveguide-basics.html> 4 pages.
AU Office Action issued in Australian Application No. 2017219169, dated Aug. 15, 2018, 7 pages.
CA Office Action issued in Canadian Application No. 2977780, dated Jul. 23, 2018, 3 pages.
Chen et al. "Qubit Architecture with High Coherence and Fast Tunable Coupling," Physical Review Letters, vol. 113(22), Nov. 2014, 10 pages.
Harris et al. "Experimental Investigation of an eight-quibit unit cell in a superconducting optimization processor," Physical Review B, vol. 82(2), Jun. 2010, 16 pages.

\* cited by examiner

MAGNETIC FLUX CONTROL IN SUPERCONDUCTING DEVICE

TECHNICAL FIELD

The present disclosure relates to magnetic flux control in superconducting devices.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, some aspects, the subject matter of the present disclosure can be embodied in devices that include: a first qubit including a first co-planar waveguide; a second qubit including a second co-planar waveguide, in which the second co-planar waveguide crosses the first co-planar waveguide; and a qubit coupler including a loop having a first lobe and a second lobe, in which a first portion of the first lobe extends parallel to the first co-planar waveguide, a second portion of the first lobe extends parallel to the second co-planar waveguide, a first portion of the second lobe extends parallel to the first co-planar waveguide, and a second portion of the second lobe extends parallel to the second co-planar waveguide.

Implementations of the devices may include one or more of the following features. For example, in some implementations, the devices include multiple ground pads arranged around a position where the second co-planar waveguide crosses the first co-planar waveguide. The multiple ground pads may consist of four ground pads arranged in a two-by-two array. Each ground pad of the multiple ground pads may be connected to multiple superconducting airbridges. For each ground pad of the multiple ground pads, at least one superconducting airbridge of the multiple superconducting airbridges may connect the ground pad to a ground plane. For each ground pad of the multiple ground pads, the at least one superconducting airbridge that connects the ground pad to the ground plane may be located at approximately a center of a corresponding side of the ground pad. For each ground pad of the multiple ground pads, at least one superconducting airbridge of multiple superconducting airbridges may connect the ground pad to an adjacent ground pad. A first ground pad of the multiple ground pads may be located within a first lobe of the qubit coupler, and a second ground pad of the multiple ground pads may be located within a second lobe of the qubit. The first lobe and the second lobe may be arranged diagonally with respect to one another around the position where the second co-planar waveguide crosses over the first co-planar waveguide.

In some implementations, the qubit coupler includes a tilt bias line connected to the second lobe, and the devices further include at least one superconducting airbridge crossing over the tilt bias line, in which a first end of each superconducting airbridge is connected to a ground plane on a first side of the tilt bias line, and a second end of each superconducting airbridge is connected to a ground plane on a second side of the tilt bias line that is opposite to the first side. Each superconducting airbridge crossing over the tilt bias line may be elongated in a direction that is orthogonal to a direction of current flow through a portion of the tilt bias line over which the superconducting airbridge crosses.

In some implementations, the qubit coupler includes a superconducting quantum interference device (SQUID) bias line connected to the first lobe through an elongated superconducting trace, and the devices further include at least one superconducting airbridge crossing over the elongated superconducting trace, wherein a first end of each superconducting airbridge is connected to a ground plane on a first side of the elongated superconducting trace, and a second end of each superconducting airbridge is connected to a ground plane on a second side of the elongated superconducting trace that is opposite to the first side. Each superconducting airbridge crossing over the elongated superconducting trace may be elongated in a direction that is orthogonal to a direction of current flow through a portion of the elongated superconducting trace over which the superconducting airbridge crosses.

In some implementations, each of the first lobe and the second lobe encircles a corresponding ground plane gap-region. The devices may further include two additional ground plane gap-regions from which the ground plane has been entirely removed, in which each ground plane gap-region is approximately the same area, and in which the ground plane gap-regions are arranged in quadrants around a position where the second co-planar waveguide crosses over the first co-planar waveguide.

In some implementations, the devices include: a first substrate, in which the first qubit, the second qubit, and the qubit coupler are arranged on the first substrate; a second substrate bonded to the first substrate; and multiple bump bonds between the first substrate. The qubit coupler may include a tilt bias line connected to the second lobe and a first elongated superconducting trace connected to the first lobe. The devices further may include: a ground plane on the first substrate, in which a first portion of the ground plane is adjacent to a first side of the tilt bias line and a second portion of the ground plane is adjacent to a second side of the tilt bias line that is opposite to the first side; and a second superconducting trace on the second substrate, in which a first bump bond connects the first portion of the ground plane to a first end of the superconducting trace, and a second bump bond connects the second portion of the ground plane to a second end of the second superconducting trace. The second superconducting trace may cross over a portion of the tilt bias line on the first substrate, and may be elongated in a direction that is orthogonal to a direction of current flow through the portion of the tilt bias line over which the second superconducting trace crosses. The devices further may include: a ground plane on the first substrate, in which a first portion of the ground plane is adjacent to a first side of the elongated first superconducting trace and a second portion of the ground plane is adjacent to a second side of the elongated first superconducting trace that is opposite to the first side; and a second superconducting trace on the second substrate, in which a first bump bond connects the first portion of the ground plane to a first end of the second superconducting trace, and a second bump bond connects the second portion of the ground plane to a second end of the second superconducting trace. The second superconducting trace may cross over a portion of the elongated first superconducting trace on the first substrate, and may be elongated in a direction that is orthogonal to a direction of current flow through the portion of the elongated first superconducting trace over which the second superconducting trace crosses.

In some implementations, the qubit coupler includes an approximately lemniscate shape.

In some implementations, the first lobe and the second lobe are arranged diagonally with respect to one another around a position where the second co-planar waveguide crosses over the first co-planar waveguide.

In some implementations, the qubit coupler crosses over the first co-planar waveguide and over the second co-planar waveguide.

In some implementations, an airgap is between the second co-planar waveguide and the first co-planar waveguide at a position where the second co-planar waveguide crosses over the first co-planar waveguide.

In some implementations, each of the first qubit and the second qubit is a co-planar waveguide flux qubit.

Particular implementations of the subject matter described here can realize one or more of the following advantages. For example, in some implementations, the tunable qubit coupler having the substantially lemniscate shape may increase the mutual inductance of associated with the first qubit and qubit coupler element (e.g., M(qubit1-coupler)), as well as the mutual inductance associated with the second qubit and qubit coupler element (e.g., M(coupler-qubit2). Additionally, the tunable qubit coupler of the present disclosure may increase the overall qubit-qubit coupling, by increasing mediated qubit to qubit coupling inductance (e.g., M(qubit1-coupler-qubit2)) relative to direct qubit to qubit coupling inductance (e.g., M(qubit1-qubit2)). By using a single loop that crosses over itself to establish an approximately lemniscate or gradiometer shape, a number of control elements for the coupler element may be reduced. Additionally, in some implementations, the approximately lemniscate or gradiometer shape of the coupler may help reduce coupler size requirements allowing for an increase in the number of circuit elements (e.g., increase in number of qubits) formed on a substrate. By introducing ground plane gap regions, it is possible, in some implementations, to provide a zero net mutual or direct inductance between two qubits. Furthermore, by providing airbridge crossover structures, lower impedance pathways for return current relative to pathways along the edges of ground planes may be provided, leading in some implementations to a reduction in crosstalk.

The details of one or more implementations are set forth in the accompanying drawings and the description below. Other features and advantages will be apparent from the description, the drawings, and the claims.

DETAILED DESCRIPTION

Quantum computing entails coherently processing quantum information stored in the quantum bits (qubits) of a quantum computer. Superconducting quantum computing is a promising implementation of quantum computing technology in which quantum computing circuit elements are formed, in part, from superconducting materials. Superconducting quantum computers are typically multilevel systems, in which the two lowest energy levels are used as the computational basis.

In certain types of quantum computing processors, such as quantum annealers, the qubits of the quantum processor are coupled together in a controllable manner such that the quantum state of each qubit affects the corresponding quantum states of the other qubits to which it is coupled. Depending on the processor design, the chosen architecture may limit the density and total number of qubits available for coupling, and thus limit the ability of the processor to perform complex problems requiring large numbers of qubits. Furthermore, in certain quantum computing designs, the qubits may suffer energy loss and decoherence due to interactions with two level systems. Accordingly, to improve the performance of a quantum computing system, such as a quantum annealer, it is useful to provide an architecture that achieves high connectivity across qubits, with a compact coupler footprint, strong qubit to qubit coupling, and low levels of crosstalk.

Figure 1A:
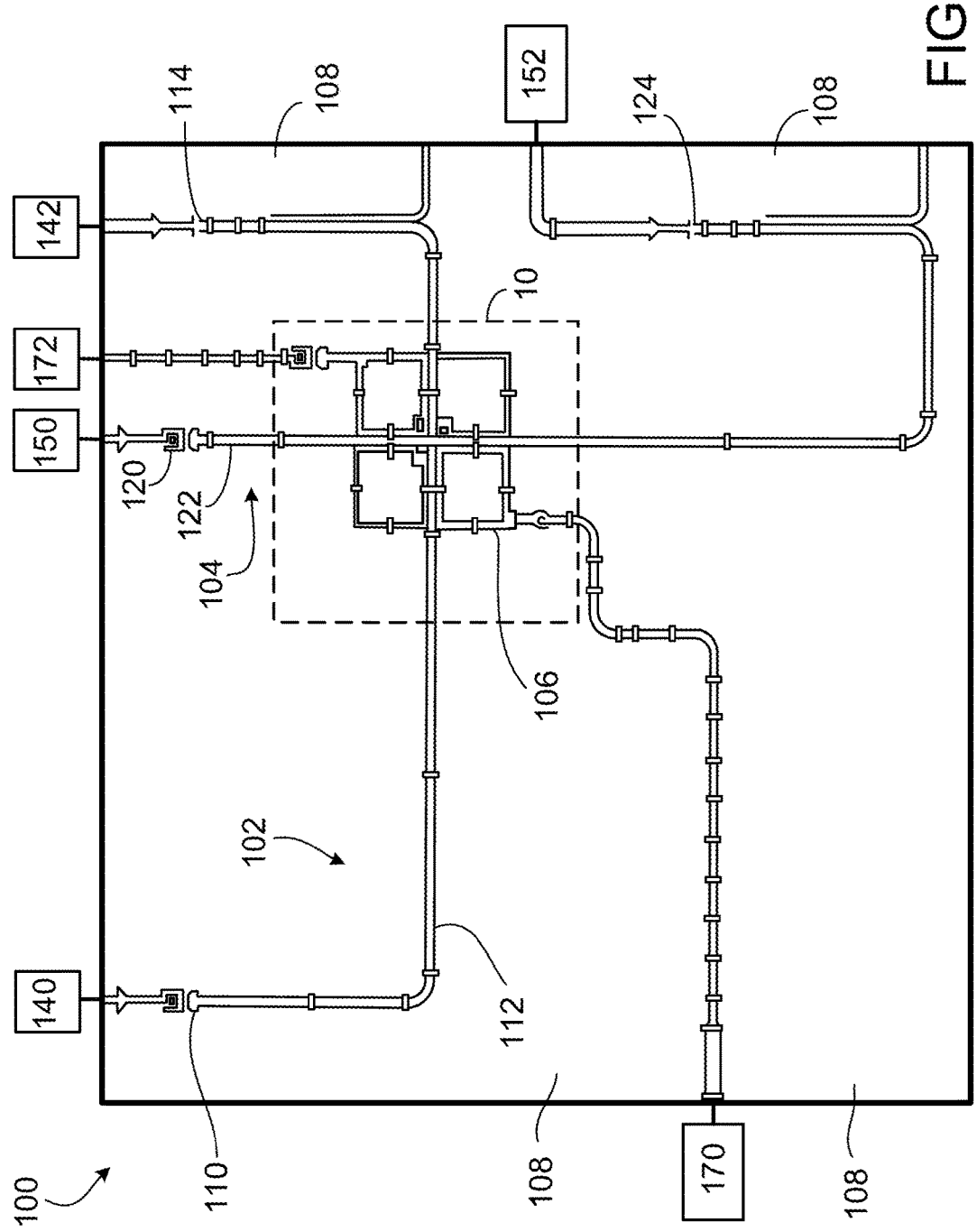
FIG. 1A is a schematic illustrating a top view of an example of a qubit coupling architecture for a quantum computing processor.

FIG. 1A is a schematic that illustrates a top view of an exemplary qubit coupling architecture 100 for a quantum processor. A quantum processor may be a physical system that includes one or more quantum information processing devices, e.g., one or more qubits, and that is used to perform quantum computations or simulations. The type of physical system included in the quantum processor may depend on the type of quantum processor and the computations to be performed. For example, in some cases, the quantum processor may be a quantum annealing device that includes a circuit of superconducting qubits, e.g., phase qubits, flux qubits, such as co-planar waveguide flux qubits, transmon qubits, gmon qubits, or other types of qubits. The qubit coupling architecture 100 shown in the example of FIG. 1A may be used as a quantum annealer. Alternatively, the qubit coupling architecture may be used for other types of quantum processors, such a quantum simulator.

Figure 1B:
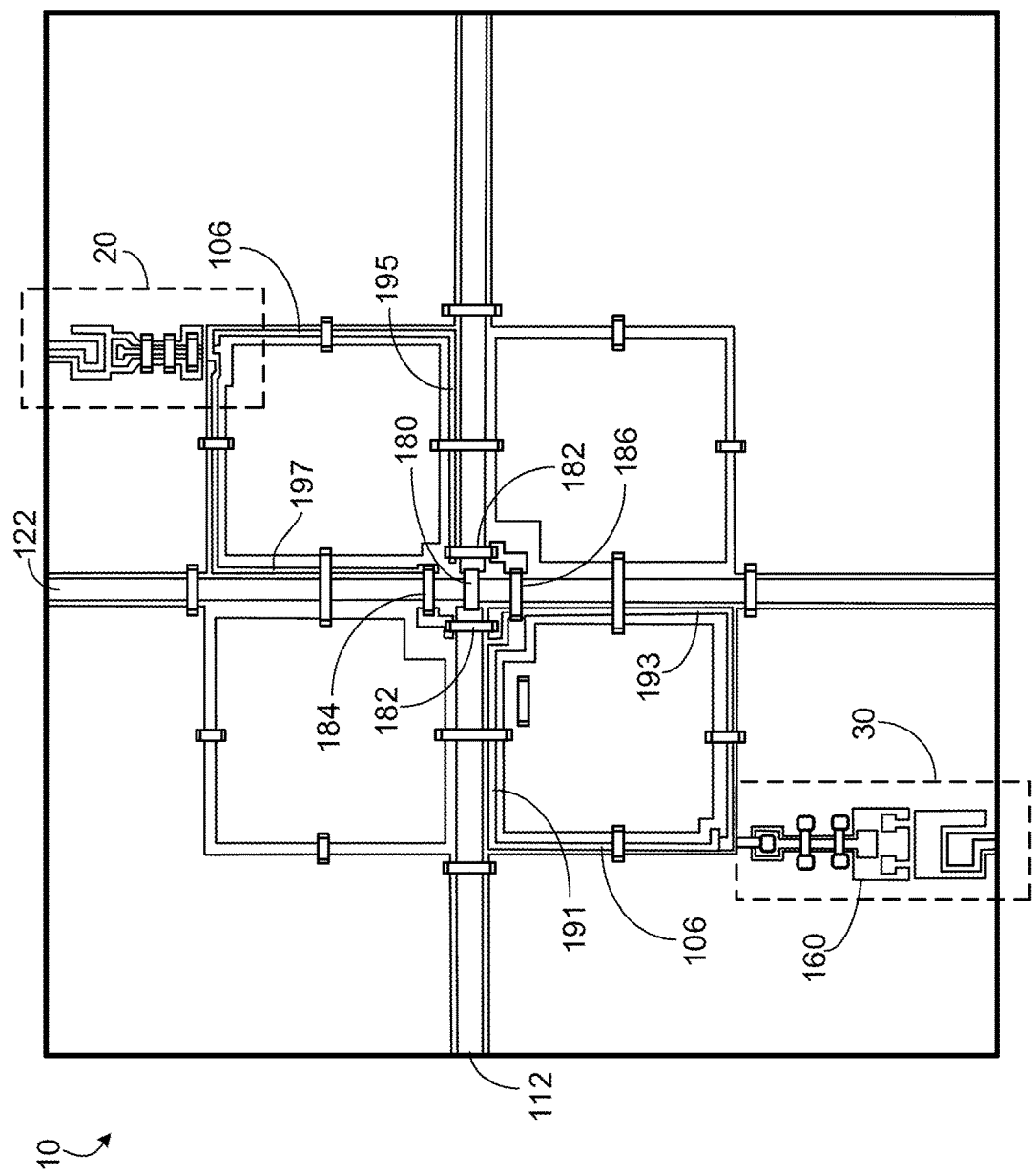
FIG. 1B is a schematic illustrating a close-up view of the qubit coupling architecture of FIG. 1A.

FIG. 1B is a schematic illustrating a close-up view of the qubit coupling architecture 100 of FIG. 1A contained within the region 10. The quantum annealer includes a first qubit 102, a second qubit 104, and a qubit coupler element 106 for coupling the first qubit 102 to the second qubit 104. The quantum annealer also includes a ground plane 108 formed from a superconducting material and arranged at various locations around the qubits and the qubit coupler. The qubits 102, 104, the qubit coupler element 106 and the ground plane 108 are formed on a dielectric substrate, such as silicon or sapphire. Though the architecture shown in FIG. 1A includes only two qubits and a single qubit coupler element, the architecture can be expanded to include additional qubits (e.g., 4, 6, 8, 10, 20, 30, 40, 50, 100, 1000 or more) and additional qubit couplers (e.g., 2, 3, 4, 5, 10, 15, 20, 25, 50, 100, 500 or more).

Each of the first qubit 102 and the second qubit 104 shown in the example of FIG. 1A is a co-planar waveguide flux qubit (also referred to as a "fluxmon qubit"). A fluxmon qubit includes a superconducting co-planar waveguide that is coupled in parallel with a superconducting quantum interference device (SQUID). For example, the first qubit 102 includes a first SQUID 110 coupled to a first end of a first co-planar waveguide 112. A second end 114 of the first co-planar waveguide 112 is tied to the ground plane 108. Similarly, the second qubit 104 includes a second SQUID 120 coupled to a first end of a second co-planar waveguide 122. A second end 124 of the second co-planar waveguide 122 is tied to the ground plane 108. The first and second co-planar waveguides 112, 122 are arranged on the substrate as elongated thin film traces of superconducting material, each of which is separated from the ground plane 108 by co-extensive gaps on either side of the elongated trace. The superconducting materials used to form the co-planar waveguides 112, 122, the SQUIDs 110, 120, and the ground plane 108 include materials exhibiting superconducting properties at or below a superconducting critical temperature, such as aluminum (superconducting critical temperature of 1.2 kelvin) or niobium (superconducting critical temperature of 9.3 kelvin).

Each of the qubits 102, 104 is couplable to tunable qubit control elements for controlling the operation of the qubits. The tunable qubit control elements may be located on the same chip on which the qubits are formed or located on a separate chip. The type of tunable qubit control elements is dependent on the type of physical system included in the quantum processor. For example, in cases where the quantum processor includes a system of superconducting qubits, e.g., arranged as a superconducting circuit, the tunable qubit control elements may provide biases that are proportional to externally applied voltages or currents that effect changes in the superconducting qubits. Each configuration of the applied biases may have a different effect on the quantum processor.

The qubit control elements can include, e.g., a SQUID bias control element and a tilt bias control element. For example, the first qubit 102 may be coupled to a first SQUID bias control element 140 and coupled to a first tilt bias control element 142. Similarly, the second qubit 104 may be coupled to a second SQUID bias control element 150 and coupled to a second tilt bias control element 152. A tilt bias control element provides control signals (e.g., flux biases) to tilt/perturb the double well potential during operation of the qubit, whereas a SQUID bias control element provides control signals (e.g., flux biases) to adjust a magnitude of the barrier between the potential wells during operation of the qubit or to change the operating frequency of the qubit. Additional control functions with the qubit control elements are also possible. Further details on the structure, fabrication and arrangement of flux qubits can be found, e.g., in WO 2017/058194, which is incorporated herein by reference in its entirety.

The qubit coupler element 106 includes an elongated superconducting trace and a SQUID 160 arranged in a loop, and is used to allow coupling between the first qubit 102 and the second qubit 104. Similar to the co-planar waveguides of the qubits, the elongated trace of the qubit coupler element 106 is formed from a material exhibiting superconducting properties at or below a superconducting critical temperature, such as aluminum (superconducting critical temperature of 1.2 kelvin) or niobium (superconducting critical temperature of 9.3 kelvin).

The qubit coupler element 106 also is couplable to tunable coupler control elements for controlling the coupling between qubits. Similar to the tunable qubit control elements, the tunable coupler control elements may provide biases that are proportional to externally applied voltages or currents that effect changes in the superconducting qubit coupler element. Each configuration of the applied biases may have a different effect on the quantum processor. As an example, the SQUID 160 of the qubit coupler element 106 is couplable to a coupler SQUID bias control element 170. At an end of the loop opposite from the SQUID 160, the qubit coupler element 106 is couplable to a coupler tilt bias control element 172. Both coupler SQUID bias control element 170 and the coupler tilt bias control element 172 may be used to control the coupler element 106, so that qubit-qubit coupling can be tuned. The SQUID bias control element 170 modifies the total critical current of the coupler SQUID element 160, while the tilt bias control element 172 changes the effective phase of the coupler SQUID element 160. The SQUID bias control element 170 may be used for tuning because it primarily introduces a local flux inside the SQUID, which is useful to reduce the crosstalk, whereas the tilt bias control element 172 may be used for coupler calibration and crosstalk compensation. Further details on the structure, fabrication and arrangement of flux qubits and coupler elements can be found, e.g., in Phys. Rev. Lett. Vol. 118, 057702 (2017) and Phys. Rev. A. Vol. 95, 052333 (2017), which are incorporated herein by reference in their entirety.

Figure 2:
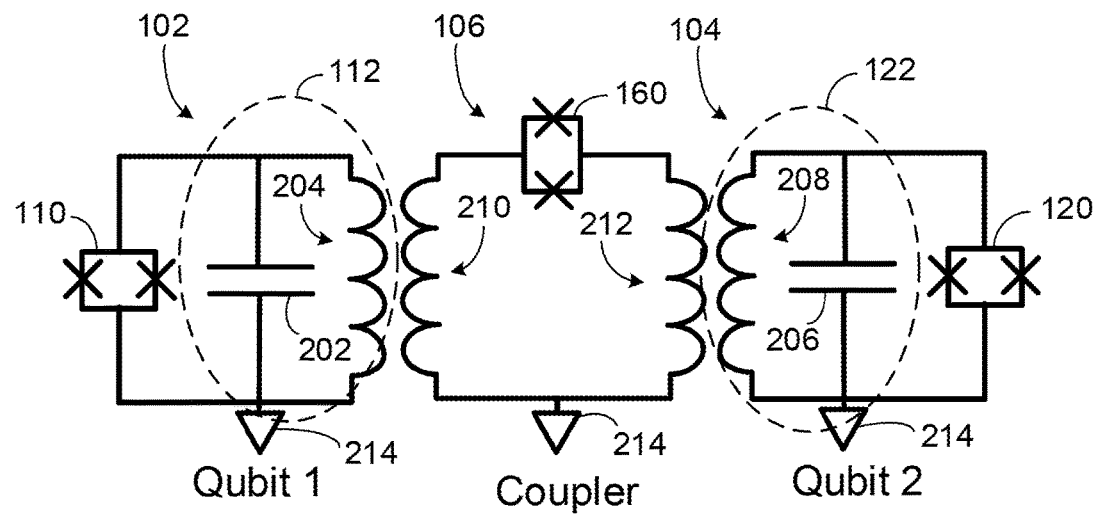
FIG. 2 is a circuit schematic that illustrates the equivalent circuit diagram of the qubit coupling architecture of FIG. 1A.

FIG. 2 is a circuit schematic that illustrates the equivalent circuit diagram for the annealer shown in FIG. 1. As shown in FIG. 2, the annealer includes a first qubit 102 composed of a first SQUID 110 coupled in parallel with a first co-planar waveguide 112, which is represented by a first capacitor 202 and a first inductor 204. The annealer also includes the second qubit 104 composed of a second SQUID 120 coupled in parallel with a second co-planar waveguide 122, which is represented by a second capacitor 206 and a second inductor 208. Between the first qubit 102 and the second qubit 104 is the qubit coupler element 106, which includes a first inductor 210 in series with a SQUID 160 and a second inductor 212. Ground 214 in the circuit diagram is provided by the ground plane 108.

Returning to FIG. 1A, the arrangement of the qubits and the qubit coupler element in architecture 100 is both compact and allows strong qubit to qubit coupling. In particular, as shown in the close-up view of FIG. 1B, the fluxmon qubits 102, 104 are arranged such that their respective co-planar waveguides cross one another orthogonally. In the example shown in FIG. 1A, the first co-planar waveguide 112 crosses over the second co-planar waveguide 122. Alternatively, the second waveguide 122 can cross over the first waveguide 112. Because the co-planar waveguides are arranged orthogonal to one another, there is little or no direct magnetic coupling between the waveguides at the point of crossing. Rather, qubit to qubit coupling is primarily achieved by positioning the qubit coupler element 106 between the co-planar waveguides 112, 122 of each qubit. The qubit coupler element 106 thus acts as a flux transformer that can magnetically couple to both qubits 102, 104.

Additional qubits can be coupled to qubit 102 in the same manner as qubit 104 by arranging the co-planar waveguides of the additional qubits to cross the first co-planar waveguide 112 of qubit 102 at different positions along the length of elongated waveguide 112. At each crossing, a corresponding qubit coupler element can be provided to allow magnetic coupling between the qubits. In this way, the first co-planar waveguide 112 can be employed as a quantum bus so that multiple qubits can couple to one another. Similarly, additional qubits can be coupled to qubit 104 by arranging the co-planar waveguides of the additional qubits to cross the second co-planar waveguide 122 of qubit 104 at different positions along the length of elongated waveguide 122. Again, at each crossing, a corresponding qubit coupler element can be provided to allow magnetic coupling between the qubits. In this way, the second co-planar waveguide 122 also can be employed as a quantum bus so that multiple qubits can couple to one another. Direct electrical contact between the co-planar waveguides at each crossing is avoided by forming a superconducting airbridge structure that jumps over the co-planar waveguide being crossed. For example, as shown in FIG. 1B, a first superconducting airbridge structure 180 extends over the second co-planar waveguide 122 and is directly electrically coupled to the first co-planar waveguide. An airgap between the airbridge 180 and the second co-planar waveguide 122 prevents electrical contact. Superconducting airbridge structures are generally oriented orthogonal to any superconducting structures over which they cross to avoid magnetic coupling between the airbridge and the structure being crossed.

To allow magnetic coupling between the first qubit 102 and the second qubit 104, the superconducting loop of the qubit coupler element 106 is formed to have an approximately lemniscate or "figure-eight" shape, in which the superconducting loop crosses over itself and over the first and second co-planar waveguides 112, 122 at multiple locations. This shape can also be referred to as the "gradiometer" design. To avoid direct electrical contact with the structures being crossed over, a superconducting airbridge is provided at each crossover point. For example, the qubit coupler element 106 can include superconducting airbridges 182 that cross over and do not directly electrically or magnetically couple to the first co-planar waveguide 112. The qubit coupler element 106 further can include a superconducting airbridge 184 that crosses over and does not electrically connect or magnetically couple to the second co-planar waveguide 122. The qubit coupler element 106 further can include a superconducting airbridge 186 that crosses over and does not electrically or magnetically couple to the second co-planar waveguide 122 and the qubit coupler element 106 itself. The superconducting airbridges of the annealer can be formed from a superconducting material, such as aluminum or niobium.

The approximate lemniscate shape of the qubit coupler element 106 includes two lobes arranged around the position where the first co-planar waveguide 112 and the second co-planar waveguide 122 cross: a first lobe located in a lower left quadrant relative to the position at which the co-planar waveguides cross; and a second lobe in an upper right quadrant relative to the position at which the co-planar waveguides cross. Each of first lobe and second lobe includes elongated linear portions of the superconducting trace that extend parallel to the co-planar waveguides. For example, the first lobe includes a first elongated portion 191 of the superconducting trace that extends parallel with the first co-planar waveguide 112 and a second elongated portion 193 of the superconducting trace that extends parallel with the second co-planar waveguide 122. The second lobe includes a first elongated portion 195 of the superconducting trace that extends parallel with the first co-planar waveguide 112 and a second elongated portion 197 of the superconducting trace that extends parallel with the second co-planar waveguide 122. By extending parallel to the co-planar waveguides, the elongated portions of the qubit coupler element 106 in each lobe can magnetically couple to the waveguides.

The coupling between the first qubit 102 and the second qubit 104 for the architecture illustrated in FIGS. 1A-1B can be expressed, e.g., in terms of mutual inductance M as:

$$M_{total}(\text{qubit}_1\text{-qubit}_2)=M(\text{qubit}_1\text{-coupler-qubit}_2)+M(\text{qubit}_1\text{-qubit}_2) \quad (1)$$

Here, the first term on the right hand side of Eq. (1), $M(\text{qubit}_1\text{-coupler-qubit}_2)$, represents the qubit to qubit coupling inductance mediated by the qubit coupler element 106, which may be tunable when a Josephson junction (e.g., a single Josephson junction or multiple Josephson junctions) is in the coupler loop. The second term on the right hand side of Eq. (1), $M(\text{qubit}_1\text{-qubit}_2)$, represents the direct qubit-qubit coupling inductance between the first qubit 102 and the second qubit 104 without the aid of the qubit coupler element. For the purpose of quantum annealing, it is preferable to provide a strong and tunable qubit-qubit coupling, which can be achieved by increasing $M(\text{qubit}_1\text{-coupler-qubit}_2)$ relative to $M(\text{qubit}_1\text{-qubit}_2)$. Additional discussion of tunable coupler design may be found, e.g., in Phys. Rev. B Vol. 80, 052506 (2009), incorporated herein by reference in its entirety.

The qubit to qubit coupling inductance mediated by the qubit coupler element, $M(\text{qubit}_1\text{-coupler-qubit}_2)$, can further be expressed as:

$$M(\text{qubit}_1\text{-coupler-qubit}_2)=[M(\text{qubit}_1\text{-coupler})\times M(\text{coupler-qubit}_2)]/L(\text{coupler}) \quad (2)$$

where L(coupler) represents the coupler self-inductance, $M(\text{qubit}_1\text{-coupler})$ represents the mutual inductance of the first qubit 102 and the qubit coupler element 106, and $M(\text{coupler-qubit}_2)$ represents the mutual inductance of the second qubit 104 and the qubit coupler element 106. Increasing the qubit-qubit coupling mediated by the qubit coupler element therefore entails increasing the mutual inductance of the coupling between the first qubit 102 and the qubit coupler element 106, and between the second qubit 104 and the qubit coupler element 106. The qubit coupling architecture illustrated in FIG. 1 provides an example configuration for increasing such mutual inductance, as will be explained herein.

Figure 3:
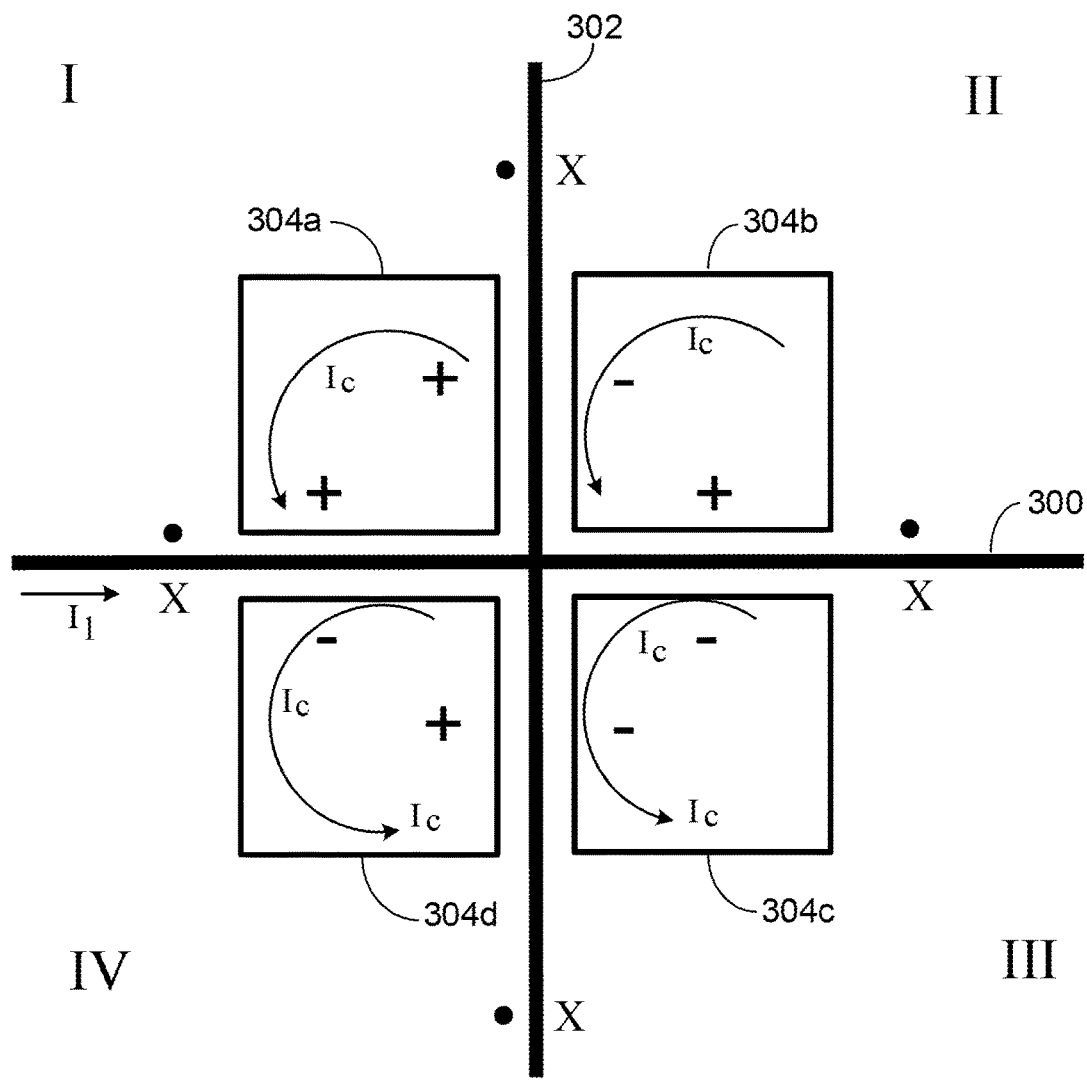
FIG. 3 is a schematic illustrating an example of the sign of mutual inductance as a result of qubit coupler current flow in different regions around a crossover point between a first and second qubit.

FIG. 3 is a schematic illustrating an example of the sign of mutual inductance (positive or negative) that results for coupler current flow in different regions around a crossover point between a first and second qubit. The horizontal line 300 represents the co-planar waveguide of the first qubit, whereas the vertical line 302 represent the co-planar waveguide of the second qubit that is crossed by the first qubit. The squares 304a-304d represent different coupler current pathways that can be arranged around the position where the first qubit co-planar waveguide crosses the second qubit co-planar waveguide. The coupler current pathways 304a-304d may be understood to be located in quadrants I-IV, respectively. For the explanation provided herein, it is assumed that current $I_1$ flows from left to right through co-planar waveguide 300 of the first qubit, and that current $I_2$ flows from bottom to top through co-planar waveguide 302 of the second qubit. With current flowing through each waveguide in the stated directions, the generated magnetic flux from the first qubit will be out of the plane of the page for the upper two quadrants (i.e., the quadrants in which coupler paths 304a and 304b are located) and into the plane of the page for the lower two quadrants (i.e., the quadrants in which coupler paths 304c and 304d are located). Similarly, the generated magnetic flux from the second qubit will be out of the plane of the page for the left two quadrants (i.e., the quadrants in which coupler paths 304a and 304d are located) and into the plane of the page for the right two quadrants (i.e., the quadrants in which the coupler paths 304b and 304c are located).

Accordingly, if current Ic flows through each of the coupler paths 304a-304d in a counterclockwise direction as shown in FIG. 3, the sign of the qubit-coupler mutual inductance will be different between directly adjacent quadrants. For example, as shown in FIG. 3, the mutual inductance between a coupler located in quadrant I and either the first qubit or the second qubit will be positive. However, the mutual inductance between a coupler located in quadrant II and the second qubit will be negative. Similarly, the mutual inductance between a coupler located in quadrant III and the first qubit will also be negative. Because of the opposite signs of mutual inductance with neighboring couplers, the coupling between the qubits and the qubit coupling elements effectively cancels out. Furthermore, even when the current Ic flowing through each of the coupler current pathways 304a-304d is reversed (e.g., in a clockwise direction), the signs of mutual inductance within each quadrant would flip, such that the coupling between the qubits and the qubit coupler elements still cancels out.

To prevent destructively cancelation of coupling between the qubits and the qubit coupling elements, the qubit coupler element may be formed to have the shape of a gradiometer (also referred to as an approximately lemniscate or "figure-eight" shape) that spans across two diagonal quadrants around the position where the co-planar waveguide of the first qubit crosses the co-planar waveguide of the second qubit, as shown in FIG. 1B. With this structure, current generally flows in one direction (e.g., counter-clockwise) in one quadrant and in a second opposite direction (e.g., clockwise) in a second diagonal quadrant. The different current pathways result in mutual inductance signs that reinforce, rather than cancel out.

Figure 4:
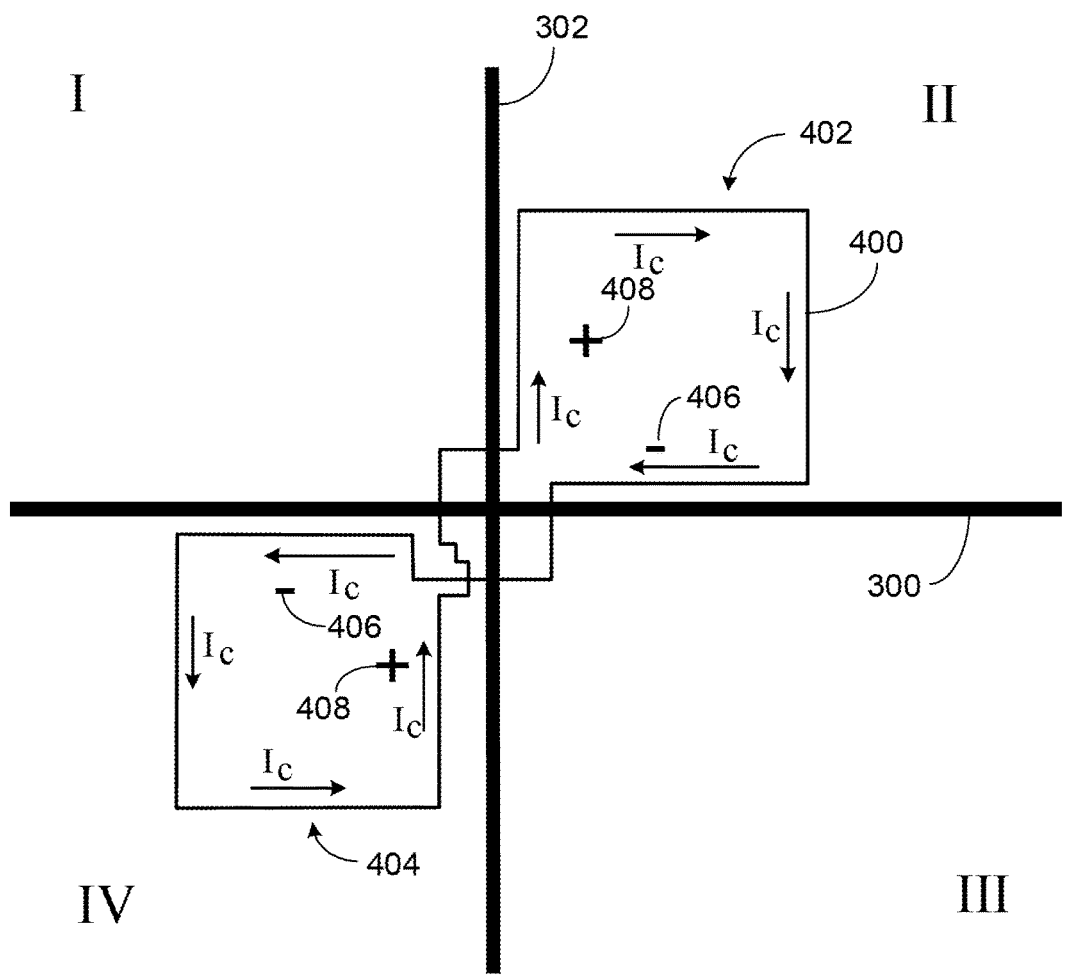
FIG. 4 is a schematic illustrating an example of the sign of mutual inductance as a result of qubit coupler current flow for a qubit coupler element having a layout depicted in FIG. 1B.

FIG. 4 is a schematic illustrating an example of the sign of mutual inductance (positive or negative) that results for coupler current flow using a coupler having a layout, such as the gradiometer design depicted in FIG. 1B. Similar to the structure depicted in FIG. 3, the horizontal line 300 represents the first co-planar waveguide of the first qubit, the vertical line 302 represents the second co-planar waveguide of the second qubit that is crossed by the first qubit, and the loop 400 represents the qubit coupler element current pathway that may be arranged around the position where the first qubit co-planar waveguide 300 crosses the second qubit co-planar waveguide 302. As shown in FIG. 4, the qubit coupler current pathway 400 overlaps both quadrant II and quadrant IV, such that the first lobe 402 and the second lobe 404 are arranged diagonally with respect to one another around a position where the second co-planar waveguide and the first co-planar waveguide cross (e.g., a first lobe 402 of the loop is located in quadrant II and a second lobe 404 of the loop is located in quadrant IV). In contrast to the current pathways depicted in FIG. 3, the current pathway 400 is a single loop. A physical implementation of the qubit coupler current pathway 400 would have the qubit coupler element crossing over the first co-planar waveguide and over the second co-planar waveguide, e.g., the qubit coupler element crosses over the first qubit and the second qubit at multiple different locations similar to qubit coupler element 106 in FIG. 1B.

As shown in FIG. 4, the coupler current Ic travels in a generally counter-clockwise direction within the second lobe 404 in quadrant IV, but once the current crosses over into the first lobe 402 in quadrant II, the current Ic travels in a generally clockwise direction. The current circulating in the coupler is induced by one of the qubits. For example, when there is current flowing in the first qubit, a flux is induced into the coupler; this flux, in turn, induces a circulating current in the coupler, the magnitude of which is controlled by the SQUID Ic. Next, the circulating current in the coupler will induce a flux into the second qubit. Accordingly, the qubit-qubit coupling may be mediated by the coupler element. Moreover, the signs 406 of mutual inductance between the qubit coupler element and the first qubit in both quadrants II and IV will be negative, thus constructively reinforcing coupling between the first qubit and the qubit coupler element. Likewise, the signs 408 of mutual inductance between the qubit coupler element and the second qubit in both quadrants II and IV will be positive, thus constructively reinforcing coupling between the second qubit and the qubit coupler element. Accordingly, an advantage of the tunable qubit coupler element 106 having the current pathway depicted in FIG. 4 is that it can increase the mutual inductance of associated with the first qubit and qubit coupler element (M(qubit$_1$-coupler)), as well as the mutual inductance associated with the second qubit and qubit coupler element (M(coupler-qubit$_2$)).

Though coupler current Ic is depicted in FIG. 4 traveling in a counter-clockwise direction in lobe 404 and a clockwise direction in lobe 402, the reverse can also be implemented within the qubit coupler element 400. That is, current can be introduced into the loop 400 so that it travels counter-clockwise in lobe 402 and clockwise in lobe 404. Constructive reinforcement of coupling between the coupler and qubits still can be achieved in this alternative implementation, but the signs of mutual inductance as shown in FIG. 4 will flip.

The coupler loop 400 shown in FIG. 4 and implemented in the example of FIG. 2 is formed as a single trace, in which the loop 400 crosses over itself to provide the approximately lemniscate shape. In some implementations, two separate coupler loops can be used instead of a single coupler loop. For instance, a first coupler loop can be positioned in quadrant IV and a second coupler loop can be positioned in quadrant II. However, providing coupler current in the desired clockwise or counter-clockwise directions to each of the first coupler loop and the second coupler loop would require separate control elements for each loop, which increases the amount of control wiring needed. Thus, an advantage of using a single loop that crosses over itself to establish an approximately lemniscate shape is that only control elements for a single loop are required.

The qubit coupler loop 400 is shown as having the first lobe 402 and the second lobe 404 in quadrants II and IV, respectively. Alternatively, in some implementations, the qubit coupler loop 400 can be arranged so the lobes are in quadrants I and III instead. So long as the general direction of the coupler current k within each lobe is opposite to that of the coupler current direction in the other lobe, constructive reinforcement of the mutual inductance can occur.

As explained herein, the qubit coupler element increases the qubit to qubit coupling as mediated by the qubit coupler element inductance (M(qubit$_1$-coupler-qubit$_2$). To further increase the total mutual inductance, $M_{total}$(qubit$_1$-qubit$_2$) in Eq. (1), the direct qubit to qubit coupling, M(qubit$_1$-qubit$_2$) can be reduced. An approach for reducing the direct qubit to qubit coupling is to introduce symmetrical ground plane gap regions in the quadrants located around the position where the first qubit co-planar waveguide and the second qubit co-planar waveguide cross. When ground plane gap regions are in traduced in each quadrant symmetrically around the crossover point, the first and second qubits will have mutual inductances with the same magnitude but opposite signs, thus providing a zero net mutual or direct inductance between the two qubits.

Figure 5:
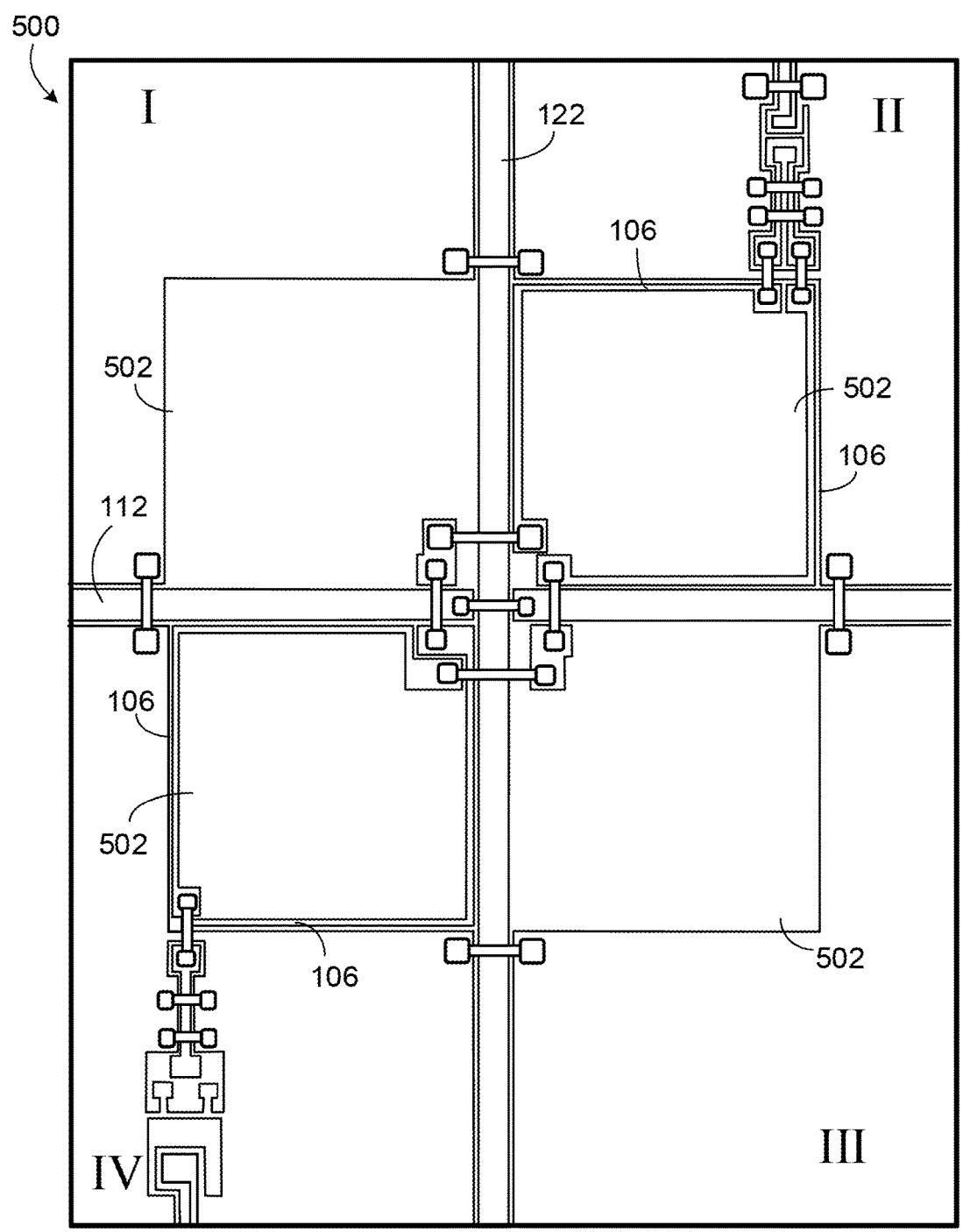
FIG. 5 is a schematic illustrating a top view of an example of a qubit coupling architecture for a quantum computing processor.

FIG. 5 is a schematic that illustrates a top view of an example of a qubit coupling architecture 500 for a quantum computing processor that introduces ground plane gap regions in the quadrants around a qubit crossover point. The architecture 500 is identical to the architecture 100 depicted in FIG. 1B, with the exception that multiple regions 502 are arranged around a position where the first co-planar waveguide 112 and the second co-planar waveguide 122 cross. The regions 502 include areas where the underlying substrate is exposed (e.g., where the ground planes are removed entirely). Accordingly, there is less superconducting material (with the exception of the qubit coupler element 106 and airbridge crossovers) positioned between the first co-planar waveguide and the second co-planar waveguide in each of the quadrants I-IV surrounding the position at which the qubit co-planar waveguides cross. The regions 502 have dimensions and are arranged such that they are symmetrically arranged around the crossover point between the first qubit and the second qubit. As a result, it is possible, in some implementations, to achieve substantially zero net direct qubit to qubit coupling in the architecture 500. In some implementations, each of the first lobe and the second lobe of the qubit coupler element encircles a corresponding gap-region 502. In some implementations, each gap-region 502 has approximately the same area. For instance, each gap region 502 shown in FIG. 5 is approximately the same area, with a small difference in area due to the presence of the superconducting trace that forms the qubit coupler element 106.

However, in some cases, the architecture 500 shown in FIG. 5 also is associated with substantial crosstalk. The crosstalk can arise, e.g., from return current that flows along the edges of the ground plane and into the SQUID of the qubit coupler element. Alternatively, or in addition, bias current and qubit current may share current pathways in multiple places, such as the edges of ground planes, the coupler SQUID loop and crossover bridges, which may contribute to crosstalk.

To reduce the cross-talk, ground pads can be provided in one or more of the regions 502 around the position where the first co-planar waveguide and the second co-planar waveguide cross. The presence of the ground pads provides alternative current paths through which the return current can travel, thus directing the return current away from the qubit coupler SQUID. An example of an architecture that includes ground pads is shown in FIG. 6.

Figure 6:
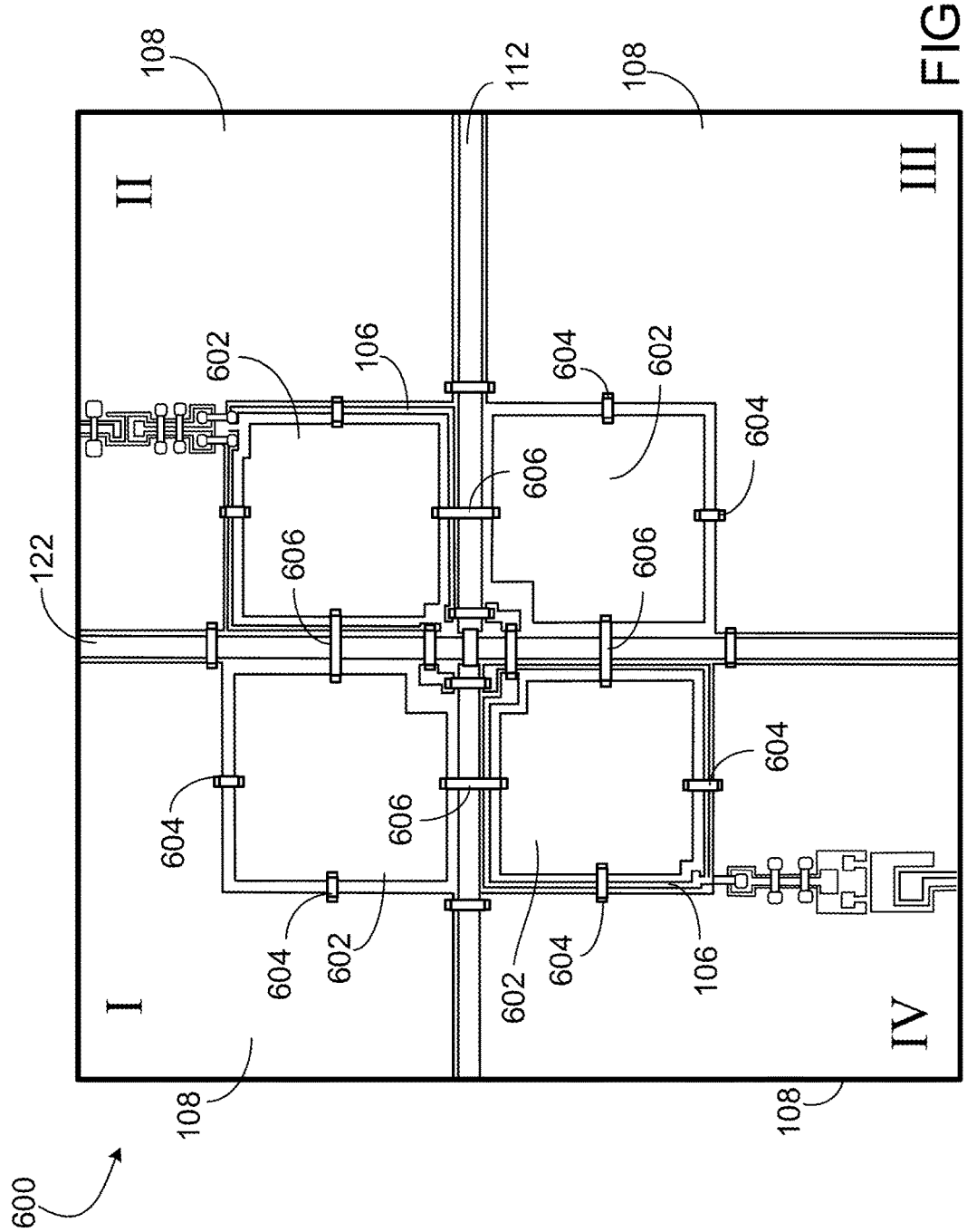
FIG. 6 is a schematic that illustrates a top view of an example of a qubit coupling architecture for a quantum computing processor.

FIG. 6 is a schematic that illustrates a top view of an example of a qubit coupling architecture 600 for a quantum computing processor. The architecture 600 is identical to the architecture 100 depicted in FIG. 1B. In particular, the qubit coupling architecture 600 includes a first co-planar waveguide 112 of a first qubit that crosses a second co-planar waveguide 122 of a second qubit, a qubit coupler element 106, and multiple airbridge crossover elements. The architecture 600 also includes multiple superconducting ground pads 602. The superconducting ground pads 602 are formed from a superconducting material, such as aluminum or niobium and are arranged in one or more quadrants around the position where the first waveguide 112 and the second waveguide 122 cross. Four ground pads 602 arranged in a two-by-two array are provided in the example shown in FIG. 6. Other number of ground pads can be provided. For example, in some implementations, a single ground pad 602 is provided (e.g., in one of the first to fourth quadrants around the position at which the waveguides cross). Alternatively, in some implementations, two or three ground pads are provided. (e.g., each in one of the first to fourth quadrants around the position at which the waveguides cross).

With the exception of multiple superconducting airbridge structures 604, 606, each ground pad 602 is physically separated from the ground plane 108 and from the first and second qubit. Each superconducting airbridge structure 604, 606 is formed from a superconducting material, such as aluminum or niobium, and establishes a direct electrical connection between the ground plane 108 and a corresponding ground pad 602 (e.g., structures 604 in FIG. 6) or between adjacent ground pads 602 (e.g., structures 606 in FIG. 6). That is, for each ground pad 602, at least one superconducting airbridge 604 connects the ground pad 602 to the ground plane 108. The superconducting airbridges 604 can connect to a ground pad 602 at approximately a center of a corresponding side of the ground pad 602. Additionally, for each ground pad 602, at least one superconducting airbridge structure 606 connects the ground pad 602 to an adjacent ground pad 602. An airgap between the airbridge structures 606 and the co-planar waveguides 112, 122 prevents electrical contact. In some cases, a ground pad 602 is positioned within a lobe of the qubit coupler element 106. For example, as shown in FIG. 6, the ground pad 602 in the bottom left quadrant (quadrant IV) is located within a first lobe of the qubit coupler element 106, whereas the ground pad 602 in the upper right quadrant (quadrant II) is located within a second lobe of the qubit coupler element 106.

The current path length through a superconducting airbridge structure 604, 606 is short relative to the current path length along the edge of the ground plane. As a result, the airbridge crossover structures 604, 606 exhibit a lower impedance and preferred alternative path for return current flowing along the edges of the ground plane 108. Thus, the return current can be substantially redirected away from the SQUID of the qubit coupler element, leading to a reduction in crosstalk.

Figure 7A:
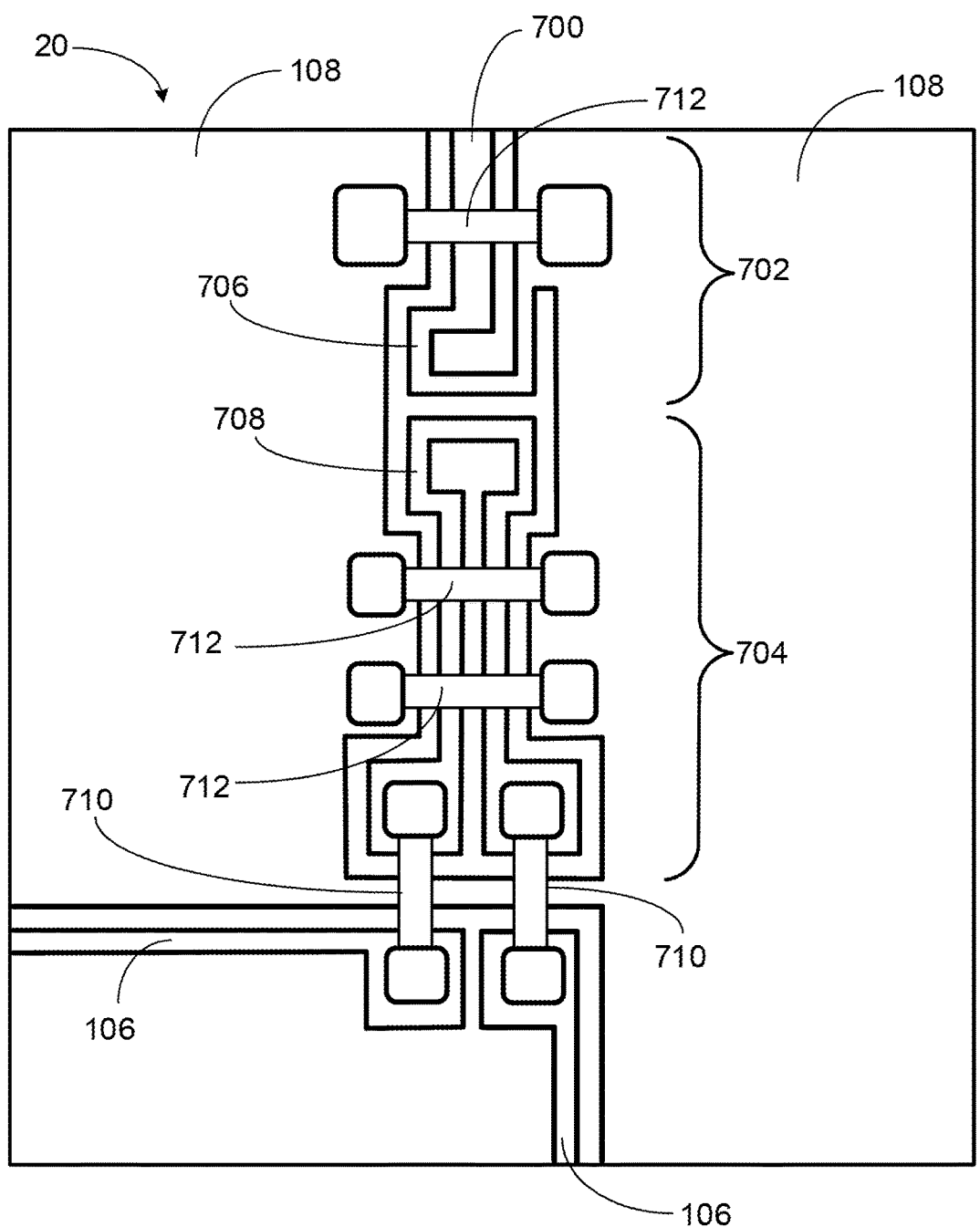
FIG. 7A is a schematic that illustrates a close-up view of a region within the structure depicted in FIG. 1B.
Figure 7B:
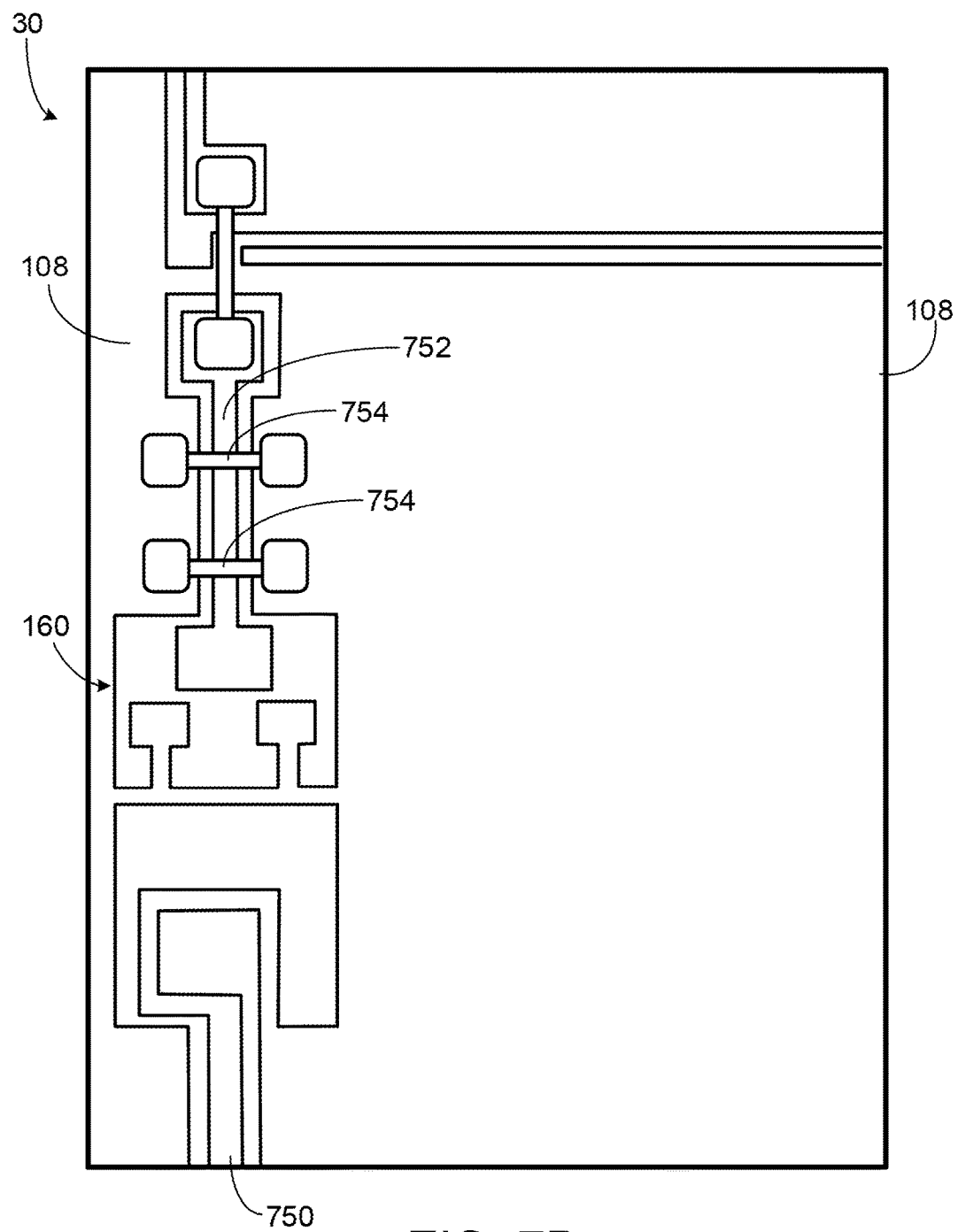
FIG. 7B is a schematic that illustrates a close-up view of a region within the structure depicted in FIG. 1B.

Alternatively, or in addition, crosstalk can be reduced by providing superconducting airbridge structures that cross over regions of the qubit-coupler architecture that are closer to the coupler bias sources, e.g., the SQUIID bias source and the coupler tilt bias source. For instance, superconducting airbridge structures can be provided that cross over a qubit coupler tilt bias line and/or that cross over a qubit coupler SQUID bias line. Examples of such configurations are shown in FIGS. 7A-7B. Crossovers placed over the bias lines are primarily used to redirect the flow of the bias currents, preventing the bias current from traveling to the edge of the ground plane.

FIG. 7A is a schematic that illustrates a close-up view of the region 20 within FIG. 1B. The region 20 covers the area where the qubit coupler element 106 (e.g., the second lobe of the qubit coupler element 106) couples to a tilt bias line 700. The tilt bias line 700 couples to a tilt bias source 172 (see FIG. 1). In the example shown in FIG. 7A, the tilt bias line 700 includes a first portion 702 and a second portion 704. The first portion 702 includes an elongated superconducting trace that forms, at a first end, a hook or partial loop region 706 that is directly electrically coupled to the ground plane 108. A second end of the first portion 702 can be coupled to the tilt bias source. The second portion 704 includes another elongated superconducting trace that also forms a loop 708 for magnetically coupling to the loop region 706 of the first portion 702. The ends of the elongated superconducting trace that forms the second portion 704 are directly electrically coupled to the qubit coupler element 106 (e.g., coupled to the second lobe of the qubit coupler element). As shown in FIG. 7A, the second portion 704 is coupled in series with the qubit coupler element 106. In some implementations, superconducting airbridge structures 710 are provided to directly electrically couple the second portion 704 to the qubit coupler element without contacting the ground plane 108.

As shown in FIG. 7A, the superconducting ground plane 108 is located on either side of the tilt bias line 700 and is separated from the tilt bias line 700 by a gap. For instance, a first portion of the ground plane 108 can be adjacent to a first side of the tilt bias line 700 whereas a second portion of the ground plane 108 can be adjacent to a second side of the tilt bias line 700 that is opposite to the first side. One or more additional superconducting airbridge structures 712 can be provided that cross over both the first portion 702 and the second portion 704 of the tilt bias line 700 to directly electrically couple the opposing portions of the ground plane 108. The presence of the superconducting airbridge structures 712 provides alternative current pathways through which return current traveling along the edges of the ground plane 108 can pass. The current path length through the superconducting airbridge structures 712 is short relative to the current path length along the edge of the ground plane 108. As a result, the airbridge crossover structures 712 exhibit a lower impedance and preferred alternative path for return current flowing along the edges of the ground plane 108. Thus, the return current can be substantially redirected away from the qubit coupler element 106, leading to a reduction in crosstalk.

FIG. 7B is a schematic that illustrates a close-up view of the region 30 within FIG. 1B. The region 30 covers the area where the qubit coupler element 106 (e.g., the first lobe of the qubit coupler element 106) couples to a SQUID bias line 750. The SQUIS bias line 750 couples to a coupler SQUID bias source 170 (see FIG. 1) and to the SQUID 160 of the qubit coupler element 106. In particular, the SQUID bias line 750 forms a loop at one end for magnetically coupling to the SQUID 160. In the example shown in FIG. 7B, the SQUID 160, in turn, is directly electrically coupled to the first lobe of the qubit coupler element 106 through an elongated superconducting trace 752.

One or more superconducting airbridge structures 754 can be provided that cross over the elongated superconducting trace 752 (and/or over the SQUID bias line 750) that is coupled to SQUID 160. A first end of each superconducting airbridge 754 is connected to the ground plane 108 on a first side of the trace 752, and a second end of each superconducting airbridge 754 is connected to the ground plane 108 on a second side of the trace 752 that is opposite to the first side. The presence of the superconducting airbridge structures 754 provides alternative current pathways through which return current traveling along the edges of the ground plane 108 can pass. The current path length through the superconducting airbridge structures 754 is short relative to the current path length along the edge of the ground plane 108. As a result, the airbridge crossover structures 754 exhibit a lower impedance and preferred alternative path for return current flowing along the edges of the ground plane 108. Thus, the return current can be substantially redirected away from the qubit coupler element 106 and from the SQUID 160, leading to a reduction in crosstalk.

While the combination of the ground pads and the superconducting airbridge crossover structures can reduce crosstalk, the presence of the ground pads, e.g., ground pads 602 in FIG. 6, also can reduce the strength of total qubit to qubit coupling given that the superconducting material forming the ground pad fills a large portion of the region between the co-planar waveguides of the first and second qubits.

In some implementations, it is possible to improve the strength of total qubit to qubit coupling while maintaining low levels of crosstalk by removing the superconducting ground pads and moving the coupler control elements, including the crossover structures to a second separate chip. The second separate chip then can be bonded to the first chip having the qubits and the qubit coupler elements. Since both chips will have separate dedicated ground planes, the crosstalk between qubits can be reduced even further, in certain implementations.

Figure 8:
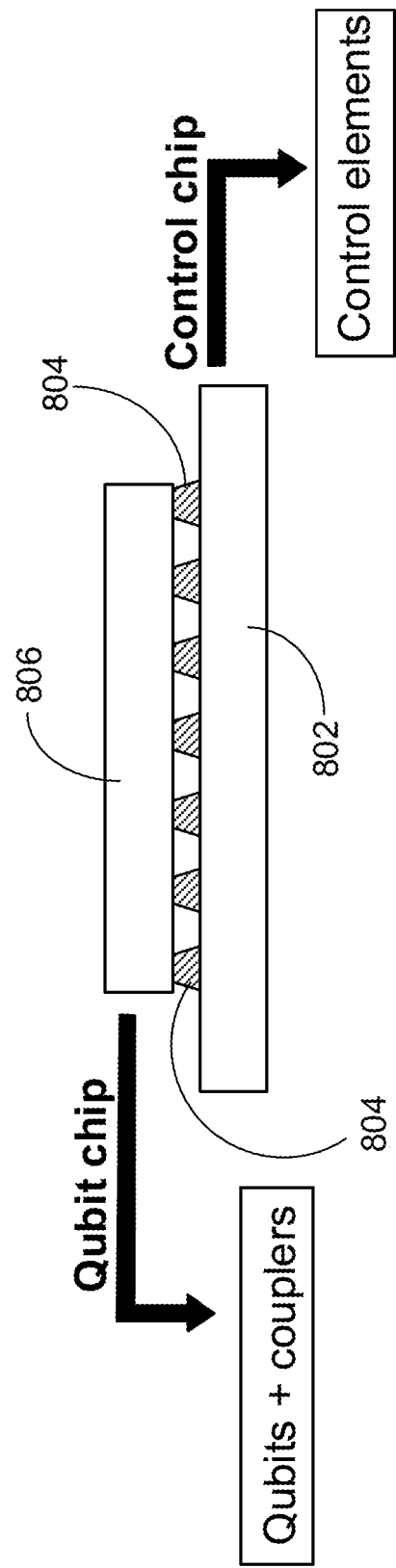
FIG. 8 is a schematic that illustrates a side view of a quantum processor that includes a first chip bonded to a second chip.

An example of the foregoing structure is shown in FIG. 8. FIG. 8 is a schematic that illustrates a side view of a quantum processor that includes a first chip 800 bonded to a second chip 802. The first chip 800 can include a dielectric substrate, such as silicon or sapphire, on which multiple qubits and qubit coupler elements are arranged. The qubits can include, e.g., fluxmon qubits, arranged as shown in FIG. 1A. Similarly, the qubits can be coupled together using qubit coupler elements, such as qubit coupler element 106. For instance, the first chip 800 can include the first qubit 102, the second qubit 104 and the qubit coupler element 106 as shown in FIG. 1A. The qubit coupler element of the first chip 800 can be configured as described herein. For example, the qubit coupler element can be arranged in loop having two lobes situated around a position where the first co-planar waveguide of the first qubit and the second co-planar waveguide of the second qubit cross. Each qubit coupler element of the first chip 800 further can include a tilt bias line (such as, e.g., bias line 700), a SQUID bias line (such as, e.g., line 750), and an elongated traces connecting the qubit coupler element to the bias lines (such as, e.g., line 752). The tilt bias line can be connected to the second lobe of the qubit coupler element and the SQUID bias line can be connected to the first lobe of the qubit coupler element as described herein. The first chip 800 can further include a first superconducting ground plane. A first portion of the ground plane can be adjacent to a first side of the tilt bias line and a second portion of the ground plane can be adjacent to a second side of the tilt bias line that is opposite to the first side, as described herein.

The second chip 802 also can include a dielectric substrate, such as silicon or sapphire. The second chip 802 further can include a second superconducting ground plane. In some implementations, the second chip 802 further can include superconducting traces that form structures such as bias lines (e.g., SQUID bias lines, tilt bias lines, qubit measurement resonators, microwave lines, among other structures and control elements). The superconducting material forming the traces and ground planes can include, e.g., aluminum and/or niobium. The second chip 802 and the first chip 800 can be bonded together using, e.g., flip-chip bonding where superconducting bump bonds 804 (e.g., indium bump bonds) provide the bonding material.

In some implementations, the superconducting bump bonds 804 provide a direct electrical connection from the first chip 800 to the second chip 802. For example, in some implementations, the superconducting bump bonds 804 provide a direct electrical connection between a superconducting material on the first chip 800 and a superconducting material on the second chip 802. For instance, the superconducting bump bonds 804 can provide a direct electrical connection between a superconducting ground plane on the first chip 800 and a superconducting ground on the second chip 802. In this way, the superconducting bump bonds 804 can provide an alternative current pathway that redirects return current on the first chip 800 to a superconducting ground plane on the second chip. By removing the return current from the first chip 800 and redirecting it to the second chip, crosstalk can be reduced further.

In some implementations, the superconducting bump bonds 804 along with a superconducting trace on the second chip 802 can function as the crossover bridge to replace the need for the airbridge structure. For example, current that would otherwise flow through a superconducting airbridge structure, such as structures 712 in FIG. 7A or structures 754 in FIG. 7B, can instead pass from a first portion of a ground plane on the first chip 800, through a first superconducting bump bond 804 to a superconducting trace formed on the second chip 802, and back through a second superconducting bump bond 804 to a second portion of the ground plane on the first chip 800. In such implementations, the superconducting trace on the second chip 802 that crosses over a portion of the tilt bias line or the SQUID bias line on the first substrate, should be elongated in a direction that is orthogonal to a direction of current flow through the portion of the tilt bias line or SQUID bias line on the first chip to avoid magnetic coupling. Accordingly, in some implementations, the quantum processor fabrication process can be simplified.

Figure 9:
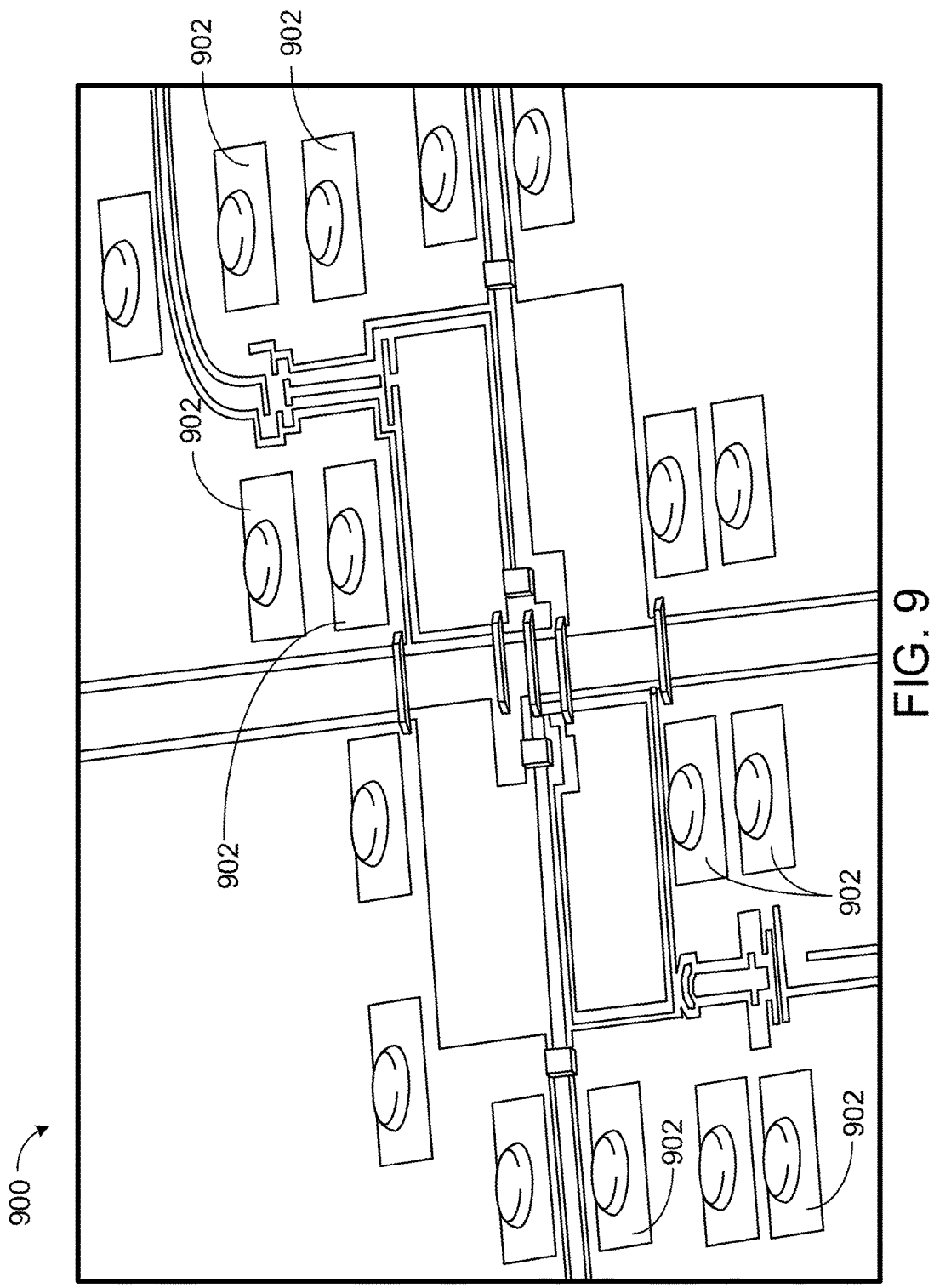
FIG. 9 is a photograph that shows an example of a first chip including qubit coupling architecture for a quantum processor.

FIG. 9 is a photograph that shows an example of a first chip including qubit coupling architecture 900 for a quantum processor. The architecture 900 shown in FIG. 9 is similar to the architecture 500 shown in FIG. 5, with the exception that the superconducting airbridge structures that crossed over the bias lines of the qubit coupler element are removed from the first chip. In their place are located bump bond pads 902. To complete the device, a second chip (such as chip 802) having one or more superconducting traces can be bonded to the chip shown in FIG. 9 to provide the alternative current pathways over the qubit coupler bias lines, and thus reduce the device crosstalk.

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Accordingly, other implementations are within the scope of the following claims.

What is claimed is:

1. A device comprising:
    a first qubit comprising a first co-planar waveguide;
    a second qubit comprising a second co-planar waveguide, wherein the second co-planar waveguide crosses the first co-planar waveguide; and
    a qubit coupler comprising a loop having a first lobe and a second lobe,
    wherein a first portion of the first lobe extends parallel to the first co-planar waveguide, a second portion of the first lobe extends parallel to the second co-planar waveguide,
    a first portion of the second lobe extends parallel to the first co-planar waveguide, and a second portion of the second lobe extends parallel to the second co-planar waveguide.

2. The device of claim 1, comprising a plurality of ground pads arranged around a position where the second co-planar waveguide crosses the first co-planar waveguide.

3. The device of claim 2, wherein the plurality of ground pads consists of four ground pads arranged in a two-by-two array.

4. The device of claim 2, wherein each ground pad of the plurality of ground pads is connected to a plurality of superconducting airbridges.

5. The device of claim 4, wherein, for each ground pad of the plurality of ground pads, at least one superconducting airbridge of the plurality of superconducting airbridges connects the ground pad to a ground plane.

6. The device of claim 5, wherein, for each ground pad of the plurality of ground pads, the at least one superconducting airbridge that connects the ground pad to the ground plane is located at approximately a center of a corresponding side of the ground pad.

7. The device of claim 4, wherein, for each ground pad of the plurality of ground pads, at least one superconducting airbridge of the plurality of superconducting airbridges connects the ground pad to an adjacent ground pad.

8. The device of claim 2, wherein a first ground pad of the plurality of ground pads is located within a first lobe of the qubit coupler, and a second ground pad of the plurality of ground pads is located within a second lobe of the qubit coupler.

9. The device of claim 8, wherein the first lobe and the second lobe are arranged diagonally with respect to one another around the position where the second co-planar waveguide crosses over the first co-planar waveguide.

10. The device of claim 1, wherein the qubit coupler comprises a tilt bias line connected to the second lobe,
    the device further comprising at least one superconducting airbridge crossing over the tilt bias line, wherein a first end of each superconducting airbridge is connected to a ground plane on a first side of the tilt bias line, and a second end of each superconducting airbridge is connected to a ground plane on a second side of the tilt bias line that is opposite to the first side.

11. The device of claim 10, wherein each superconducting airbridge crossing over the tilt bias line is elongated in a direction that is orthogonal to a direction of current flow through a portion of the tilt bias line over which the superconducting airbridge crosses.

12. The device of claim 1, wherein the qubit coupler comprises a superconducting quantum interference device (SQUID) bias line connected to the first lobe through an elongated superconducting trace,
    the device further comprising at least one superconducting airbridge crossing over the elongated superconducting trace, wherein a first end of each superconducting airbridge is connected to a ground plane on a first side of the elongated superconducting trace, and a second end of each superconducting airbridge is connected to a ground plane on a second side of the elongated superconducting trace that is opposite to the first side.

13. The device of claim 12, wherein each superconducting airbridge crossing over the elongated superconducting trace is elongated in a direction that is orthogonal to a direction of current flow through a portion of the elongated superconducting trace over which the superconducting airbridge crosses.

14. The device of claim 1, wherein each of the first lobe and the second lobe encircles a corresponding ground plane gap-region.

15. The device of claim 14, further comprising two additional ground plane gap-regions from which the ground plane has been entirely removed,
  wherein each ground plane gap-region is approximately the same area, and
  wherein the ground plane gap-regions are arranged in quadrants around a position where the second co-planar waveguide crosses over the first co-planar waveguide.

16. The device of claim 1, comprising:
  a first substrate, wherein the first qubit, the second qubit, and the qubit coupler are arranged on the first substrate;
  a second substrate bonded to the first substrate; and
  a plurality of bump bonds between the first substrate and the second substrate.

17. The device of claim 16, wherein the qubit coupler comprises a tilt bias line connected to the second lobe and a first elongated superconducting trace connected to the first lobe.

18. The device of claim 17 comprising:
  a ground plane on the first substrate, wherein a first portion of the ground plane is adjacent to a first side of the tilt bias line and a second portion of the ground plane is adjacent to a second side of the tilt bias line that is opposite to the first side; and
  a second superconducting trace on the second substrate, wherein a first bump bond connects the first portion of the ground plane to a first end of the superconducting trace, and a second bump bond connects the second portion of the ground plane to a second end of the second superconducting trace.

19. The device of claim 18, wherein the second superconducting trace crosses over a portion of the tilt bias line on the first substrate, and is elongated in a direction that is orthogonal to a direction of current flow through the portion of the tilt bias line over which the second superconducting trace crosses.

20. The device of claim 17 comprising:
  a ground plane on the first substrate, wherein a first portion of the ground plane is adjacent to a first side of the elongated first superconducting trace and a second portion of the ground plane is adjacent to a second side of the elongated first superconducting trace that is opposite to the first side; and
  a second superconducting trace on the second substrate, wherein a first bump bond connects the first portion of the ground plane to a first end of the second superconducting trace, and a second bump bond connects the second portion of the ground plane to a second end of the second superconducting trace.

21. The device of claim 20, wherein the second superconducting trace crosses over a portion of the elongated first superconducting trace on the first substrate, and is elongated in a direction that is orthogonal to a direction of current flow through the portion of the elongated first superconducting trace over which the second superconducting trace crosses.

22. The device of claim 1, wherein the qubit coupler comprises an approximately lemniscate shape.

23. The device of claim 1, wherein the first lobe and the second lobe are arranged diagonally with respect to one another around a position where the second co-planar waveguide crosses over the first co-planar waveguide.

24. The device of claim 1, wherein the qubit coupler crosses over the first co-planar waveguide and over the second co-planar waveguide.

25. The device of claim 1, wherein an airgap is between the second co-planar waveguide and the first co-planar waveguide at a position where the second co-planar waveguide crosses over the first co-planar waveguide.

26. The device of claim 1, wherein each of the first qubit and the second qubit is a co-planar waveguide flux qubit.

* * * * *